United States Patent
Maheedhar et al.

(10) Patent No.: US 7,349,190 B1
(45) Date of Patent: Mar. 25, 2008

(54) RESISTOR-LESS ACCURATE LOW VOLTAGE DETECT CIRCUIT AND METHOD FOR DETECTING A LOW VOLTAGE CONDITION

(75) Inventors: Suryadevara Maheedhar, Bangalore (IN); Badrinarayanan Kothandaraman, Bangalore (IN)

(73) Assignee: Cypress Semiconductor Corp., San Jose, CA (US)

( * ) Notice: Subject to any disclaimer, the term of this patent is extended or adjusted under 35 U.S.C. 154(b) by 357 days.

(21) Appl. No.: 11/020,972

(22) Filed: Dec. 22, 2004

Related U.S. Application Data (60) Provisional application No. 60/531,817, filed on Dec. 22, 2003.

(51) Int. Cl.
*H02H 3/24* (2006.01)
*H02H 3/20* (2006.01)
*H02H 9/04* (2006.01)
*H03K 5/22* (2006.01)
*H03K 5/153* (2006.01)

(52) U.S. Cl. .................... 361/92; 361/91.5; 327/77
(58) Field of Classification Search ................ 361/92, 361/91.5; 327/77
See application file for complete search history.

(56) References Cited

U.S. PATENT DOCUMENTS

| | | | |
|---|---|---|---|
| 4,013,902 A | 3/1977 | Payne | |
| 5,440,254 A | 8/1995 | Sundby | |
| 5,493,251 A | 2/1996 | Khambaty et al. | |
| 5,847,591 A | 12/1998 | Schnell | |
| 5,867,047 A | 2/1999 | Kraus | |
| 6,147,521 A | 11/2000 | Degoirat et al. | |
| 6,492,849 B2 | 12/2002 | Ikoma et al. | |
| 6,664,825 B2 | 12/2003 | Ishikawa et al. | |
| 2002/0014637 A1 | 2/2002 | Higuchi | |
| 2003/0122590 A1* | 7/2003 | O ................................ | 327/77 |
| 2004/0093531 A1 | 5/2004 | Espinor et al. | |

* cited by examiner

*Primary Examiner*—Michael Sherry
*Assistant Examiner*—Dharti H Patel
(74) *Attorney, Agent, or Firm*—Kevin L. Daffer; Daffer McDaniel, LLP

(57) ABSTRACT

A low voltage detect circuit is provided herein for detecting when an external voltage (Vext) drops below a predetermined minimum voltage. In general, the low voltage detect circuit described herein may be configured to detect a low voltage condition based on a threshold voltage difference between a non-zero threshold transistor having a substantially non-zero threshold voltage, and a zero threshold transistor having a threshold voltage relatively close to zero. According to a particularly advantageous aspect of the invention, the low voltage detect circuit described herein comprises substantially no resistors or reference voltage generation circuits, and therefore, provides significant savings in both current and die area consumption without sacrificing accuracy. The low voltage detect circuit of the present invention is particularly useful in power regulators, such as those used in memory systems or devices.

22 Claims, 2 Drawing Sheets

RESISTOR-LESS ACCURATE LOW VOLTAGE DETECT CIRCUIT AND METHOD FOR DETECTING A LOW VOLTAGE CONDITION

PRIORITY APPLICATION

This application claims priority to provisional application No. 60/531,817 entitled "Resistor-less Accurate Low Voltage Detect Circuit" filed Dec. 22, 2003.

BACKGROUND OF THE INVENTION

1. Field of the Invention

The present invention relates generally to semiconductor integrated circuits, and more particularly, to circuits and systems that use low voltage detect circuits for detecting when an external power supply drops below a predetermined minimum voltage. Other embodiments of the invention may relate to a voltage detect circuit capable of detecting alternative voltage levels and/or voltage ranges.

2. Description of the Related Art

The following descriptions and examples are given as background only.

Low voltage detect (LVD) circuits are often included in low-power or battery powered systems, such as portable electronic devices, to detect low-voltage conditions that may harm the low-power system or prevent the low-power system from operating properly. For example, a low voltage detect circuit may be used to protect the internal logic states of volatile memory (e.g., RAM, control registers, etc.) within a low-power system when a power supply voltage supplied thereto drops below a predetermined minimum voltage (e.g., when batteries become weak or removed). The LVD circuit may be used to compare the power supply voltage to the predetermined minimum voltage, and to generate a low voltage detect signal (LVDET) whenever the power supply voltage drops below the predetermined minimum value.

Figure 1:
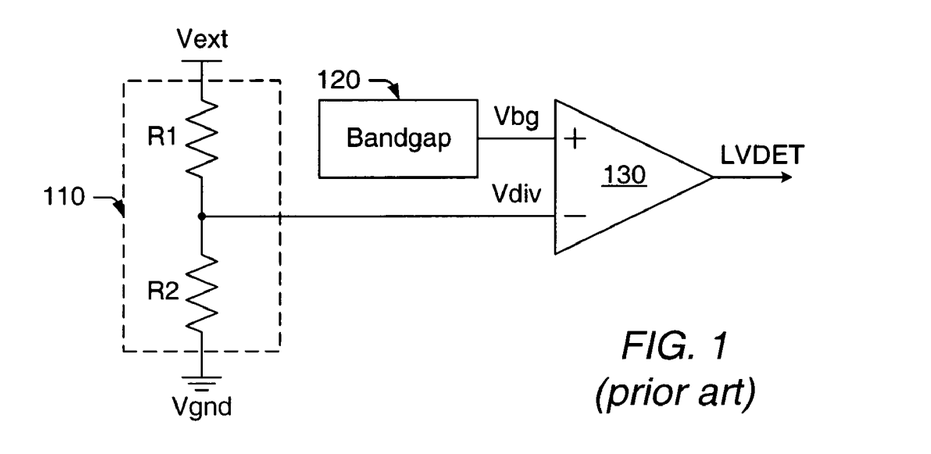
FIG. 1 is a block diagram of a conventional low voltage detect circuit.

Previous LVD circuits were often based on comparing a resistively divided value of the power supply voltage to a stable reference voltage provided, for example, by a reference voltage generator (such as a bandgap reference circuit). A block diagram of a conventional low voltage detect circuit 100 is shown in FIG. 1 as including a resistor divider network 110, a bandgap reference circuit 120 and a differential amplifier or comparator 130. In FIG. 1, an externally supplied voltage (Vext) is divided by resistor divider network 110, and the divided voltage (Vdiv) is compared by comparator 130 with the stable reference voltage generated by reference voltage generator 120. In most cases, the stable reference voltage may be generated by a bandgap reference circuit, and thus, is shown here as a bandgap reference voltage (Vbg). Bandgap reference circuits are often used in LVD circuits for their ability to produce reference voltages with relatively high accuracy.

As shown in FIG. 1, resistor divider network 110 may include two or more resistors, such as resistors R1 and R2, which are coupled in series between the externally supplied voltage and ground. The resistors are generally ratioed so that the divided output voltage, Vdiv, is equal to the reference voltage, Vbg, when the externally supplied voltage, Vext, attains a predetermined voltage level. In some cases, LVD circuit 100 may be configured to produce a low-voltage detect signal (LVDET) whenever the externally supplied voltage (Vext) decreases, such that the divided voltage (Vdiv) drops below the predetermined voltage level set by the reference voltage (Vbg).

Although satisfactory for a number of applications in the past, the above approach is not wholly satisfactory for the latest generation of devices and systems for a number of reasons.

One significant disadvantage of the above circuit is that large resistors, e.g., in the range of 1.5 to 15 mega-ohms (MΩ) or more, may be required to reduce the standby current through the resistor divider network. However, the large size of the resistors can make it difficult to utilize the same low voltage detect circuit on a number of different Integrated Circuit (IC) chips having different layouts. In addition, relatively large amounts of standby current may still be dissipated even when large resistors are used in the resistor divider network. For example, a standby current of approximately 400 nano-amperes (nA) may be generated within resistor divider network 110 when 15 MΩ resistors are used. The relatively large standby current can make the circuit unsuitable for a number of low-power or battery powered applications, including memory used in mobile devices, such as MoBL™ SRAM (Static Random Access Memory), a commercially available product from Cypress Semiconductor of San Jose, Calif. Moreover, due to layout area constraints on the chips, it is generally not possible to increase the resistances within the resistor divider network to effectively reduce the standby current. In other words, layout constraints on a given IC chip may limit the size of the resistors that may be used in the divider network, thereby limiting the potential reduction in standby current.

Another disadvantage of LVD circuit 100 is the need for a stable reference voltage generation circuit, such as bandgap circuit 120. Bandgap circuit 120 tends to exacerbate the power dissipation problem by consuming additional amounts of current (e.g., a few hundred nA) and die area. If the bandgap circuit were eliminated, the saved current and area could be used elsewhere, thereby imparting greater flexibility to the overall system design. In addition, bandgap circuits tend to become considerably less accurate as the power supply voltage drops to within a few hundred millivolts of the generated reference voltage. The decrease in accuracy is especially prevalent in the power supply ranges (e.g., about 0.9V to about 2.1V) at which LVD circuits typically operate.

Accordingly, a need exists for a low voltage detect circuit that eliminates the need for resistor divider networks and reference voltage generation circuits without adversely impacting the accuracy of the voltage detect circuit. In addition to providing other advantages, such a low voltage detect circuit would significantly reduce the amount of standby current and die area consumed by the circuit.

SUMMARY OF THE INVENTION

The present invention provides a solution to these and other problems, and offers further advantages over conventional low voltage detect circuits. It is noted, however, that the following are mere exemplary embodiments of an improved low voltage detect circuit and are not to be construed in any way to limit the subject matter of the claims.

In one aspect, the invention is directed to a low voltage detect circuit for detecting when an external voltage (Vext) drops below a predetermined minimum voltage. In general, the low voltage detect circuit described herein may be configured to detect a low voltage condition based on a threshold voltage difference between a transistor with a substantially non-zero threshold voltage, hereinafter referred to as a "non-zero threshold transistor," and a transistor with a threshold voltage relatively close to zero, hereinafter referred to as a "zero threshold transistor". According to a particularly advantageous aspect of the invention, the low voltage detect circuit described herein comprises substantially no resistors or reference voltage generation circuits, and therefore, provides significant savings in both current and die area consumption.

BRIEF DESCRIPTION OF THE DRAWINGS

These and various other features and advantages of the present invention will be apparent upon reading of the following detailed description in conjunction with the accompanying drawings and the appended claims provided below, where:

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

The present invention is generally directed to a low voltage detect circuit for detecting a drop in voltage from an external power supply below a predetermined minimum threshold voltage. A logic circuit and method according to one embodiment of the present invention will now be described in reference to FIG. 2.

Figure 2:
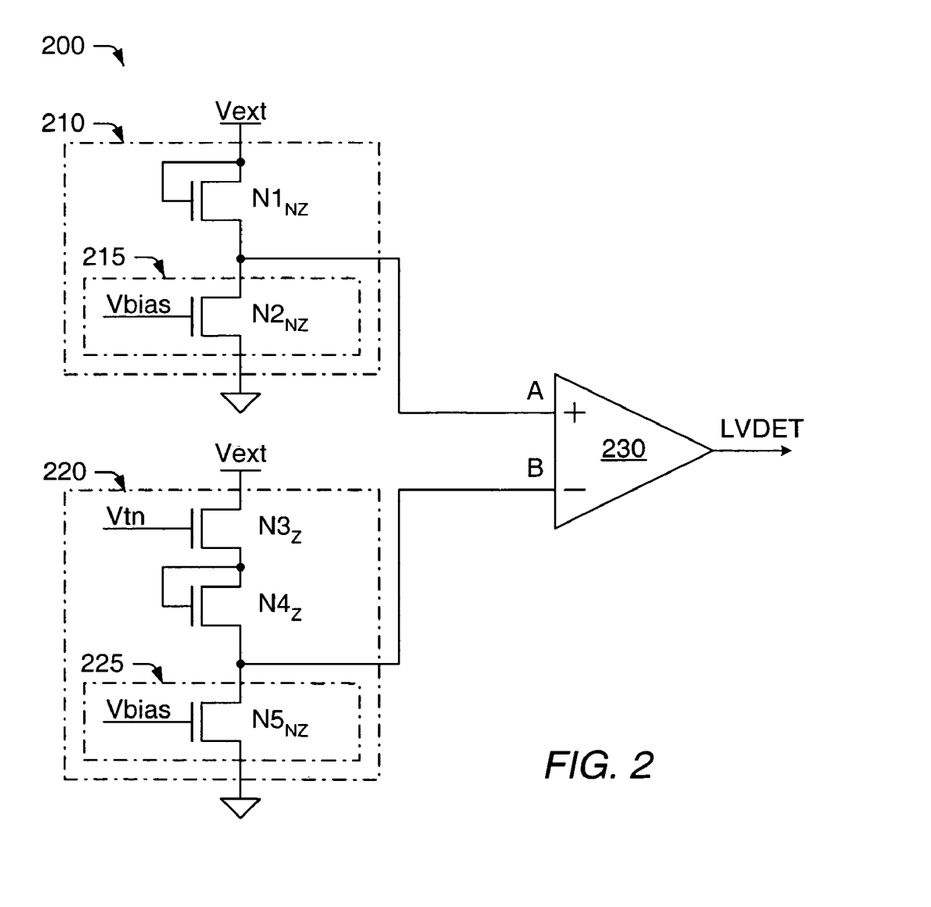
FIG. 2 is a block diagram of a low voltage detect circuit according to one embodiment of the present invention.

FIG. 2 is a block diagram of a low voltage detect (LVD) circuit according to one embodiment of the present invention. As shown in FIG. 2, LVD circuit 200 generally includes a first sub-circuit 210, a second sub-circuit 220 and a differential amplifier or comparator 230. The first and second sub-circuits of FIG. 2 each include a plurality of N-channel Metal Oxide Semiconductor (NMOS) transistors, which are coupled in series between an externally supplied voltage (Vext) and ground. Though NMOS transistors are used in the embodiment of FIG. 2 and described herein, one skilled in the art would readily understand how the circuit could be modified to include PMOS transistors instead of, or in addition to, NMOS transistors. As such, PMOS and CMOS implementations of the low voltage detect circuit may be considered alternative embodiments of the invention.

In some cases, the externally supplied voltage (Vext) may be a system power supply voltage on the order of about 2.1V to about 3.9V. In other cases, however, the externally supplied voltage may comprise a substantially lower power supply voltage, e.g., on the order of about 0.9V to about 2.1V. As such, the voltage detect circuit described herein may operate at substantially any power supply level.

Figure 3:
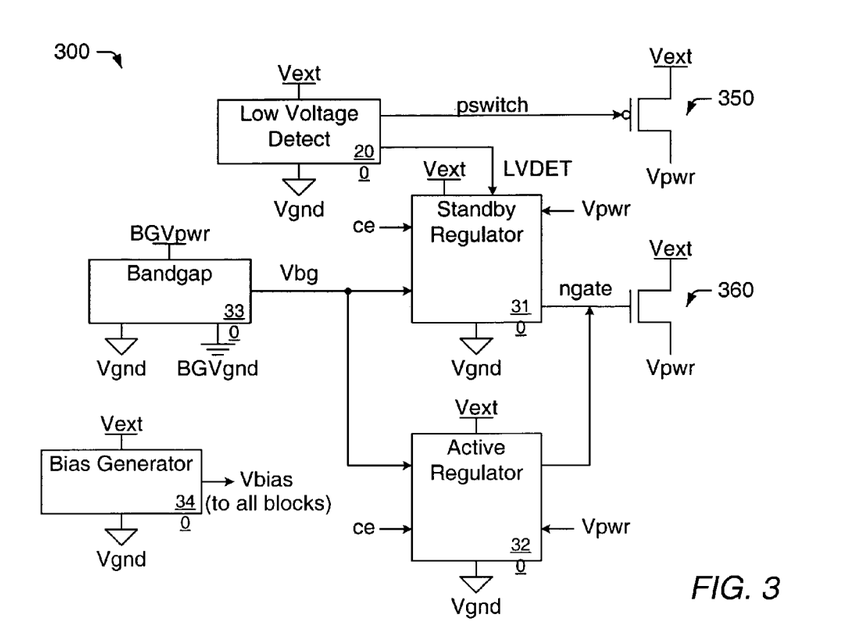
FIG. 3 is a block diagram of an exemplary power regulator including the low voltage detect circuit shown in FIG. 2.

In the embodiment of FIG. 2, first sub-circuit 210 includes a diode-connected NMOS transistor (N1) and a biasing stage 215, which is coupled in series with the diode-connected transistor between a power supply node and ground. In this manner, the external voltage (Vext) is supplied to the gate and drain terminals of diode-connected transistor N1, the source terminal of which is coupled to biasing stage 215. In some cases, biasing stage 215 may include only one NMOS bias transistor (N2), as shown in FIG. 2. A bias voltage (Vbias) is supplied to a gate terminal of the bias transistor during circuit operation. The bias voltage may comprise substantially any voltage level, which provides a sufficient amount of current for biasing the diode-connected transistor (N1). As shown in FIG. 3, the bias voltage may be generated by a bias generator (340) coupled to low voltage detect circuit 200.

In other cases, biasing stage 215 may include more than one serially-coupled NMOS bias transistor, each configured for receiving the same bias voltage (Vbias) at a gate terminal thereof. For example, one or more additional NMOS bias transistors may be cascaded with NMOS bias transistor N2 to limit the gate-to-drain voltage of transistor N2. Such a case may be referred to herein as "cascading for gate-oxide protection," and may not be necessary if bias transistor N2 can withstand the gate-to-drain voltage incurred without the addition of the extra bias transistors.

First sub-circuit 210 is generally configured to produce a voltage signal, A, which is substantially less than or equal to the external voltage. In the embodiment of FIG. 2, voltage signal A is generated at the source node of diode-connected NMOS transistor N1 and supplied to the non-inverting input of comparator 230. The term "diode-connected" is used herein to describe a transistor whose gate and drain terminals are mutually coupled. By utilizing a diode-connected transistor for transistor N1, the voltage level present at the source terminal of transistor N1 (i.e., voltage signal A) may be substantially equal to the external voltage (Vext) minus a threshold voltage associated with transistor N1. The particular threshold voltage associated with transistor N1 will be described in more detail below.

In the embodiment of FIG. 2, second sub-circuit 220 includes a pair of serially-coupled NMOS transistors (N3, N4) and a biasing stage 225, which is coupled in series with the pair of serially-coupled transistors between the power supply node and ground. In this manner, the external voltage (Vext) is supplied to the drain terminal of transistor N3, the gate of which is coupled for receiving a turn-on voltage (Vtn). The source terminal of transistor N3 is coupled to the gate and drain terminals of diode-connected transistor N4, which in turn, is coupled to biasing stage 225. Similar to biasing stage 215, biasing stage 225 may include one or more serially-coupled NMOS bias transistors, each configured for receiving a bias voltage (Vbias) at a gate terminal thereof. As noted above, the bias voltage may comprise substantially any voltage level, which provides a sufficient amount of current for biasing transistors N3 and N4. In some embodiments, the bias voltages supplied to biasing stages 215 and 225, as well as comparator 230, may differ; however, they may be relatively the same, in other embodiments of the invention.

Second sub-circuit 220 is generally configured to produce a voltage signal, B, which is substantially equal to a potential difference between threshold voltages of at least one "non-zero threshold transistor" and at least one "zero threshold transistor." In the embodiment of FIG. 2, voltage signal B is generated at the source node of NMOS transistor N4 and supplied to the inverting input of comparator 230. By utilizing a pair of serially-coupled transistors, the voltage level present at the source terminal of transistor N4 (i.e., voltage signal B) may be substantially equal to the difference between a threshold voltage associated with transistor N5 and the combined threshold voltage of transistors N3 and N4.

As known in the art, the transistor "threshold voltage" is generally defined as the gate voltage required to "turn on" a transistor, and may be a positive or negative voltage depending on whether the transistor is an N-channel or P-channel device configured in native, depletion or enhancement mode. For example, the threshold voltage of an N-channel MOS (NMOS) transistor is generally positive for enhancement-mode and negative for depletion-mode. The opposite is true for PMOS devices.

To form an enhancement-mode NMOS, a p-type dopant is typically ion implanted onto the surface of a p-type well formed within a semiconductor substrate. Source and drain regions may then be fabricated within the p-type well by implanting or diffusing an n-type dopant within the source/drain regions. By "enhancing" the surface of the well with a p-type dopant, the transistor threshold voltage is increased and, thus, a greater gate voltage is needed to enable current flow through the channel region formed between the source and drain regions. On the other hand, a depletion-mode NMOS may be formed by implanting an n-type dopant onto the surface of the p-type well before the source and drain regions are formed. By "depleting" the surface with an n-type dopant, the transistor threshold voltage is decreased, thus lowering the gate voltage needed to induce current flow through the channel region. Typically, the threshold voltages of enhancement and depletion-mode NMOS transistors may range between about 0.7V and about 0.0V.

In a similar manner, PMOS transistors are typically formed by implanting p-type dopants within the source/drain regions of an n-type well. If an enhancement-mode PMOS is desired, surface enhancement may be performed to decrease the transistor threshold voltage by doping the surface of the well (and therefore, the channel region) with an n-type impurity. On the other hand, surface depletion may be performed to increase the transistor threshold voltage by doping the surface of the well (and therefore, the channel region) with a p-type impurity, if a depletion-mode PMOS is desired. Typically, the threshold voltages of enhancement and depletion-mode PMOS transistors may range between about −0.7V and about 0.0V.

In some cases, the magnitude of the transistor threshold voltage may be "tweaked" or adjusted during semiconductor fabrication by the use of an additional ion implantation technique. Such a technique may be referred to as a "threshold adjust implantation" and may be performed, for example, by implanting boron, phosphorus or arsenic ions into the regions under the gate oxide (e.g., within the channel region) before the source/drain regions are formed. The implantation of boron causes a positive shift in the threshold voltage, while phosphorus or arsenic implantation causes a negative shift. Therefore, the relatively large positive threshold voltages of an enhancement-mode NMOS or depletion-mode PMOS may be reduced by implanting phosphorus or arsenic ions into the channel region. In addition, the relatively large negative threshold voltages of a depletion-mode NMOS or enhancement-mode PMOS may be raised by implanting boron ions into the channel region.

In some cases, the threshold adjust implantation may be used to form transistors with relatively low magnitude threshold voltages; these transistors may be referred to herein as "low-Vt transistors," and may exhibit threshold voltage magnitudes within a range of about 0.5V to about 1.0V. In other cases, the threshold adjust implantation may be used to form "high-Vt transistors" with threshold voltage magnitudes within a range of about 1.0V to about 1.5V. Alternative threshold voltage magnitudes may be realized by altering various process parameters (e.g., dopant concentration).

A transistor is said to be "native" if no surface enhancement, depletion or threshold adjust implantation steps are performed during fabrication of the MOS device. In other words, the channel region of a native transistor is formed directly on the surface of the well without performing an ion implantation or diffusion after well formation. The native or unimplanted threshold voltage of an NMOS device typically ranges between about −0.2V and about +0.2V. In a preferred embodiment, a native NMOS device may exhibit a threshold voltage substantially equal to 0V. On the other hand, the native or unimplanted threshold voltage of a PMOS device typically ranges between about −1.6V to about −1.8V. To bring the threshold voltage closer to 0V, one or more ion implantation steps may be performed after well formation to raise the threshold voltage of the PMOS device. In some cases, one or more threshold adjust implantation steps may be performed to raise the threshold voltage of the PMOS device to within a range of about −0.4V to about +0.4V. In a preferred embodiment, the threshold voltage of the ion implanted PMOS transistor may be substantially closer to 0V (e.g., within the −0.3V to +0.3V range, or the −0.2V to +0.2V range) or may be substantially equal to 0V.

As used herein, a transistor whose threshold voltage is substantially equal to zero volts (e.g., within ±0.4V) is referred to as a "zero threshold transistor." Examples of zero threshold transistors include native NMOS transistors, as well as PMOS transistors that have undergone an ion implantation or diffusion step to bring its threshold voltage closer to zero volts. Conversely, any transistor whose threshold voltage is substantially greater than or less than zero volts (e.g., greater than about +0.4V or less than about −0.4V) will be referred to herein as a "non-zero threshold transistor." Examples of non-zero threshold transistors include NMOS and PMOS transistors that have undergone surface enhancement, depletion and/or threshold adjust implantation steps.

According to a particular aspect of the invention, the transistors within the first sub-circuit (e.g., transistors N1 and N2) may each comprise "non-zero threshold transistors," while a mixture of "zero threshold" and "non-zero threshold" transistors are used within the second sub-circuit. For example, the pair of serially-coupled transistors within the second sub-circuit (e.g., transistors N3 and N4) may utilize "zero threshold transistors," while a "non-zero threshold transistor" is used within biasing stage 225. As such, the voltage signal (A) generated by the first sub-circuit may be approximately one non-zero threshold voltage ($V_{TH\_NZ}$) lower than the external voltage (Vext). On the other hand, the voltage signal (B) generated by the second sub-circuit may be approximately equal to a potential difference between a non-zero threshold voltage ($V_{TH\_NZ}$) and the combination of two zero threshold voltages ($V_{TH\_Z}$). In other words, voltage signal A may be substantially equal to (Vext−$V_{TH\_NZ}$), whereas voltage signal B may be substantially equal to ($V_{TH\_NZ}$−2*$V_{TH\_Z}$), in the embodiment of FIG. 2.

The comparator 230 of the low voltage detect circuit generally functions to compare voltage signal, A, with voltage signal, B, and to generate a low voltage detect (LVDET) signal whenever voltage signal A becomes less than or equal to voltage signal B. In the embodiment of FIG. 2, voltage signal A is generated at a node arranged between non-zero threshold transistors N1 and N2. In some cases, non-zero threshold transistors N1 and N2 may each be "low-Vt" NMOS transistors with threshold voltages ($V_{TH\_LVNMOS}$) in the range of about 0.8-0.9V. As such, voltage signal A may be approximately equal to the external voltage (Vext) minus a threshold voltage ($V_{TH\_LVNMOS}$) of a "low-Vt" NMOS transistor (LVNMOS), or:

$$\text{Signal } A = V_{ext} - V_{TH\_LVNMOS} \qquad (\text{Eq. 1})$$

In the embodiment of FIG. 2, voltage signal B is generated at a node arranged between the pair of serially-coupled zero-threshold transistors (N3, N4) and the non-zero threshold transistor (N5) of biasing stage 225. In some cases, non-zero threshold transistor N5 may be a low-Vt NMOS transistor with a threshold voltage ($V_{TH\_LVNMOS}$) in the range of about 0.8-0.9V. Transistors N3 and N4, on the other hand, may be native NMOS transistors with threshold voltages ($V_{TH\_Native}$) in the range of about ±0.2V. In a preferred embodiment, the threshold voltage of the native NMOS transistors may be substantially close to 0V, and more preferably, substantially equal to 0V. As such, voltage signal B may be approximately equal to the low-Vt threshold voltage ($V_{TH\_LVNMOS}$) of transistor N5 minus twice the Native NMOS threshold voltage ($2V_{TH\_Native}$) of transistors N3 and N4, or:

$$\text{Signal } B = V_{TH\_LVNMOS} - 2V_{TH\_Native} \qquad (\text{Eq. 2})$$

Therefore, in the embodiment of FIG. 2, the trip point of the comparator (e.g., LVDET=1) occurs when:

$$\text{Signal } A \leq \text{Signal } B \qquad (\text{Eq. 3})$$

$$V_{ext} - V_{TH\_LVNMOS} \leq V_{TH\_LVNMOS} - 2V_{TH\_Native} \qquad (\text{Eq. 4})$$

$$V_{ext} \leq 2(V_{TH\_LVNMOS} - V_{TH\_Native}) \qquad (\text{Eq. 5})$$

In other words, the low voltage detect circuit described herein generates an active high signal, LVDET, when the external voltage (Vext) drops below a predetermined minimum voltage.

In one exemplary embodiment, the predetermined minimum voltage [i.e., the term $2(V_{TH\_LVNMOS} - V_{TH\_Native})$] has a nominal value of about 1.8 volts. In such an embodiment, the comparator compares the external voltage (Vext) with a predetermined minimum voltage of about 1.8 volts, and generates a logic high signal (e.g., LVDET=1) whenever Vext becomes less than or equal to the predetermined minimum voltage.

In other embodiments, the predetermined minimum voltage may be modified by using different types, sizes and/or numbers of zero and non-zero threshold transistors within the first and second sub-circuits of LVD circuit 200. For example, the predetermined minimum voltage may be increased by utilizing so-called "high-Vt" transistors, which have slightly higher threshold voltages (e.g., between about 1.0V and about 1.5V) than the "low-Vt" transistors used for N1, N2 and N5. In another example, the sizes of the transistors used in the first and second sub-circuits may be "tweaked" to provide slight modifications (e.g., on the order of ±500 mV) to the predetermined minimum voltage. If somewhat larger modifications are desired, the number of non-zero threshold transistors in the first sub-circuit and the number of zero-threshold transistors in the second sub-circuit can also be altered.

For example, the predetermined minimum voltage can be increased to approximately $(2+N)*(V_{TH\_NZ} - V_{TH\_Z})$ by adding N-number of diode-connected non-zero threshold transistors to the first sub-circuit and N-number of diode-connected zero threshold transistors to the second sub-circuit. Referring to FIG. 2, the additional diode-connected non-zero threshold transistors would be coupled in series between the source terminal of transistor N1 and the non-inverting input of comparator 230. Likewise, the additional diode-connected zero threshold transistors would be coupled in series between the source terminal of transistor N4 and the inverting input of comparator 230. In doing so, a low voltage detect signal (LVDET) may be generated when:

$$V_{ext} \leq (2+N)*(V_{TH\_NZ} - V_{TH\_Z}) \qquad (\text{Eq. 5})$$

In some cases, N may be selected from a range of integer values comprising about 1 to about 5. If N=2, e.g., the predetermined minimum voltage may be approximately equal to about 3.6V. Though larger values of N may be used in some high-power applications, the value of N is typically limited by the external voltage supplied to the low voltage detect circuit.

In another example, the predetermined minimum voltage can be reduced to approximately $(V_{TH\_NZ} - V_{TH\_Z})$ by eliminating the diode-connected transistors in the first and second sub-circuits. Referring to FIG. 2, transistor N1 would be eliminated, so that the power supply node could be directly coupled to the non-inverting input of the comparator. In addition, transistor N4 would be eliminated, so that transistor N3 may be directly coupled between the power supply node and the inverting input of the comparator. In doing so, a low voltage detect signal (LVDET) may be generated when:

$$V_{ext} \leq (V_{TH\_NZ} - V_{TH\_Z}) \qquad (\text{Eq. 6})$$

In keeping with the example of low voltage and native NMOS transistors, the LVDET signal may be generated whenever the external voltage becomes less than or equal to a predetermined minimum voltage of about 0.9V.

According to a particularly advantageous aspect of the invention, the low voltage detect circuit described herein includes no resistors or reference voltage generation circuits. As such, the present circuit consumes considerably less standby current and die area than most conventional low voltage detect circuits. For example, the circuit shown in FIG. 2 may consume a maximum standby current of about 120 nA, which is at least 75% less than the standby current consumed (typically more than 400 nA) in most conventional low voltage detect circuits.

In addition, the low voltage detect circuit of the present invention provides these savings without sacrificing accuracy by eliminating the use of bandgap reference circuits and exploiting the relatively constant difference between threshold voltages of so-called "zero threshold" and "non-zero threshold" transistors. For example, the present invention exploits the fact that the term $(V_{TH\_NZ} - V_{TH\_Z})$ will be fairly constant, and independent of Process, Voltage, and Temperature (PVT) variations, since $V_{TH\_NZ}$ and $V_{TH\_Z}$ track each other across PVT corners. The zero and non-zero threshold voltages are able to "track each other" for several reasons. First, the processing steps used to make the zero and non-zero threshold transistors are substantially identical, with the exception of one or more ion implantation steps.

Therefore, the effect of process variation on the threshold voltages is relatively small. In addition, when the zero and non-zero threshold transistors are all NMOS (or alternatively, all PMOS), the effect of voltage and temperature variations on the threshold voltages is relatively constant. This enables the potential difference between the zero and non-zero threshold voltages to remain fairly constant over process, voltage and temperature corners. In one embodiment, the potential difference between the zero and non-zero threshold voltages, and thus, the comparator trip point, may exhibit a maximum variation of about ±100 mV. The variation in trip point is due to the slight discrepancy (e.g., about ±50 or less due to process and body effect mismatches) between the threshold voltages of zero and non-zero threshold transistors. However, such variation is considered acceptable for most low voltage detect circuits.

FIG. 3 illustrates one embodiment of a voltage regulator 300 that may incorporate the low voltage detect circuit of FIG. 2. In some embodiments, voltage regulator 300 may be utilized within a memory device or system, such as memory system 400 of FIG. 4, for transforming an external power supply voltage (Vext) into a constant internal voltage (Vpwr) to be used by the memory device 410. In some cases, the LVDET signal can be used, for example, to pull-up the internally regulated power supply (Vpwr) applied to memory device 410 when the external voltage (Vext) is ramping up from a data retention voltage to a normal operating voltage. However, for relatively low external voltages, the LVDET signal can also be used to short out the internally regulated power supply of the memory device with the external voltage supplied to the memory system. Such a case will be described in more detail below with reference to the voltage regulator shown in FIG. 3.

As noted above, voltage regulator 300 may be used for generating a stable internal power supply voltage (Vpwr) from an external power supply (Vext). As shown in FIG. 3, voltage regulator 300 may generally include a standby regulator 310, an active regulator 320, a bandgap reference circuit 330, a bias generator 340, a PMOS transistor 350 and an NMOS transistor 360. Bias generator 340 typically functions to generate and supply bias voltages (Vbias) to all of the circuit blocks shown in FIG. 3. As described in more detail below, low voltage detect circuit 200 may be included within voltage regulator 300 for detecting a low voltage condition, which may occur when the external power supply falls below a predetermined minimum value.

In general, standby regulator 310 and active regulator 320 may be configured for generating a stable internal supply voltage (Vpwr) from the bandgap voltage (Vbg) supplied thereto by bandgap reference generator 330. For example, standby regulator 310 and active regulator 320 may each include an operational amplifier ("op amp"), which is configured for driving a source follower. As shown in FIG. 3, the standby and active regulators may drive the same source follower (i.e., NMOS transistor 360) with a signal labeled "ngate." The "ngate" signal may be adjusted (via feedback) to obtain a desired internal power supply voltage (Vpwr). Due to its substantially faster response time, active regulator 320 consumes considerably more current than standby regulator 310 (e.g., micro-amperes vs. nano-amperes), and therefore, may operate only during times when the chip enable signal (labeled "ce") is enabled. In some cases, the stable supply voltage generated by regulators 310 and 320 may be approximately 1.5 times the bandgap voltage (typically about 1.2V), but may be higher or lower in other cases.

As noted above, low voltage detect circuit 200 may be included for shorting the internal power supply (Vpwr) with the external power supply (Vext) when the external power supply falls below the predetermined minimum value. For example, low voltage detect circuit 200 may be configured for generating a signal (labeled "pswitch"), which is complimentary to the low voltage detect (LVDET) signal. In one example, circuit 200 may generate an active "high" LVDET signal and an active "low" pswitch signal when a low voltage condition is detected. Once a low voltage condition is detected, the pswitch signal generated by LVD circuit 200 may short the internal power supply with the external power supply by turning on PMOS transistor 350. The LVDET signal may be used, for example, to help the standby and active regulators come out of a data-retention mode, once the internal power supply starts to increase, by maintaining the core voltage in the regulators.

Figure 4:
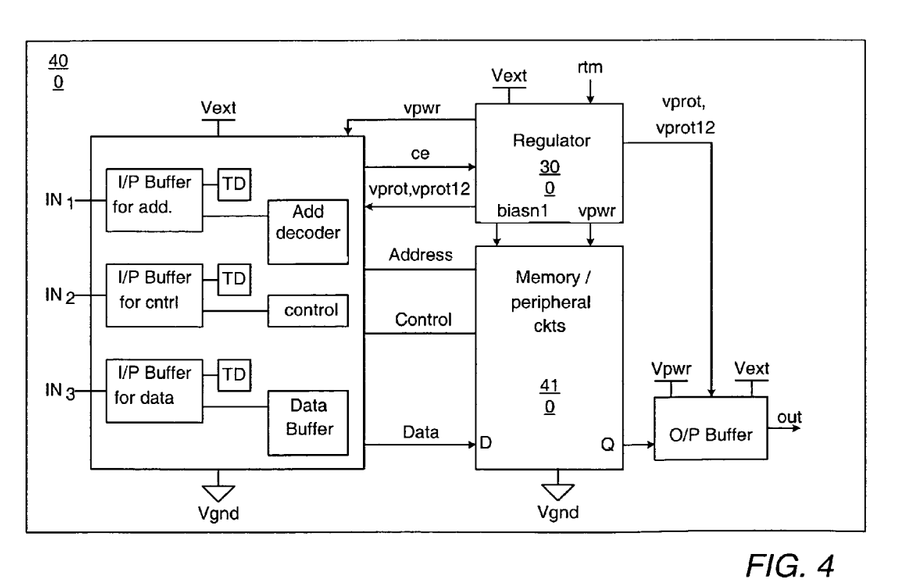
FIG. 4 is a block diagram of an exemplary memory system including the power regulator shown in FIG. 3.

FIG. 4 illustrates one embodiment of a memory system 400, which may include the voltage regulator 300 described above and shown in FIG. 3. Generally speaking, memory system 400 may include a memory device 410 with peripheral circuits for reading and writing data to one or more memory blocks included therein. In addition, memory system 400 may include various buffers and decoders for controlling how data is stored within and read from memory device 410. For example, incoming/outgoing data may be temporarily stored within the input/output buffers of memory system 400. Based on the address inputs deciphered by the address decoder, the data may be stored within (or read from) a particular location within memory device 410. The control I/P buffers decide whether to store/read the data. As described in more detail above, the voltage regulator (300) generates a stable and noiseless internal power supply, which is typically lower than external power supply voltage. The internal power supply is typically used by all circuits on the memory chip.

In general embodiments, the low voltage detect circuit described herein may be used wherever voltage detection is desired, such as in most low-power or battery-powered memory systems. In some cases, the low voltage detect circuit described herein may be included within memory used in mobile devices, such as MoBL™ SRAM, a commercially available product from Cypress Semiconductor of San Jose, Calif. However, the circuit described herein is not limited to memory systems and may be alternatively incorporated within any system or device, which benefits from voltage detection. In addition to detecting low voltage conditions, the voltage detect circuit described herein can be modified for detecting when an external voltage exceeds a particular voltage level or falls within a particular range of voltages. In some cases, for example, the external voltage supplied to a IC chip can go as high as 5V, or more. If elements within the chip cannot withstand that much voltage, a voltage detect circuit can be used to limit the voltage supplied to those circuit elements.

When used for detecting different voltage ranges within an IC chip, the voltage detect circuit described herein may eliminate the need for metal options or bond options commonly used to distinguish the different voltage ranges. The elimination of bond and metal options may improve inventory control and simplify the fabrication process by eliminating the additional processing step needed to fabricate the bond or metal options. In addition, since bond and metal options are used for specifying a particular voltage level or range, the ability to perform voltage detection without requiring pre-set voltage levels (provided by the bond and metal options) increases the flexibility of the voltage detection circuit. This situation is ideal for customers, as the customer can configure the voltage detection circuit described herein for substantially any voltage level or range.

Certain embodiments and/or aspects of the invention will now be repeated for emphasis. In a general embodiment, the invention is directed to a low voltage detect circuit for detecting when an external voltage (Vext) drops below a predetermined minimum voltage. According to a particularly advantageous aspect of the invention, the low voltage detect circuit described herein is configured for detecting a low voltage condition based on a threshold voltage difference between zero and non-zero threshold MOS transistors. Unlike conventional low voltage detect circuits, the low voltage detect circuit described herein comprises substantially no resistors or reference voltage generation circuits, and therefore, provides significant savings in both current and die area consumption.

In some embodiments, N-channel MOS (NMOS) transistors may be used to form the zero and non-zero threshold transistors of the low voltage detect circuit, while other embodiments of the invention may utilize P-channel MOS (PMOS) transistors. If PMOS transistors are used, the non-zero threshold transistors may have a non-zero threshold voltage ($V_{TH\_NZ}$) within a range of about −0.5V to about −1.5V, while the zero threshold transistors have a threshold voltage ($V_{TH\_Z}$), which is substantially closer to zero volts, e.g., within a range of about −0.4V to about +0.4V. If NMOS transistors are used, the non-zero threshold transistors may have a non-zero threshold voltage ($V_{TH\_NZ}$) within a range of about 0.5V to about 1.5V, while the zero threshold transistors have a zero threshold voltage ($V_{TH\_Z}$) within a range of about −0.4V to about +0.4V.

In a preferred embodiment, the non-zero threshold transistors may have a threshold voltage between about 0.8V to about 0.9V, while the zero threshold transistors have a threshold voltage of about −0.2V to about +0.2V, regardless of whether NMOS or PMOS transistors are used.

In one embodiment, the low voltage detect circuit described herein may include: (i) a first sub-circuit configured to generate a voltage signal, A, which is substantially less than or equal to the external power supply voltage; (ii) a second sub-circuit configured to generate a voltage signal, B, which is substantially equal to a threshold voltage difference between at least one non-zero threshold MOS transistor and at least one zero threshold MOS transistor; and (iii) a comparator configured to compare voltage signals A and B, and to generate a Low Voltage Detect (LVDET) signal when voltage signal A becomes less than or equal to voltage signal B.

In a particular embodiment, the first sub-circuit generally includes a first non-zero threshold NMOS transistor in conjunction with a low current biasing stage. The first non-zero threshold transistor is diode-connected, and therefore, configured for receiving the external voltage at gate and drain terminals thereof. The first voltage signal, A, which is taken from the source terminal of the first diode-connected NMOS, is supplied to a first input of the comparator. The second sub-circuit generally includes a pair of serially coupled zero threshold NMOS transistors in conjunction with another low current biasing stage, which is coupled in series with the pair of zero threshold NMOS transistors between the power supply node and ground. The pair of zero threshold NMOS transistors includes a first zero threshold NMOS and a second zero threshold NMOS; the second being diode-connected and configured for receiving a threshold voltage difference between a non-zero threshold transistor and a zero threshold transistor, at gate and drain terminals thereof. The second voltage signal, B, which is taken from the source terminal of the second zero threshold NMOS, is supplied to a second input of the comparator.

In one preferred version of this embodiment, the comparator trip point is set to approximately 1.8 volts and has a maximum variation of about +/−100 milli-volts (mV) across process, voltage, and temperature (PVT) corners. In addition, the low voltage detect circuit described herein has a standby current consumption of no greater than about 120 nano-amperes (nA). As such, the low voltage detect circuit of the present invention may be particularly useful in power regulators, such as those used in low-power or battery-powered memory systems or devices.

It will be appreciated that a Low Voltage Detect circuit according to the present invention provides at least the following advantages:

(i) A completely resistor-less design making the circuit very easy to reuse, or adapt to be used, across any number of IC chips and products lines. Moreover, although the use of resistors is avoided, accuracy hasn't been compromised in the present design. As noted above, for example, the comparator trip point has a maximum variation of +/−100 mV across PVT corners;

(ii) A 75% (or more) reduction in standby current consumption over most conventional designs. For example, it was previously noted that the circuit shown in FIG. 2 has a maximum standby current consumption of about 120 nA, versus a standby current of more than 400 nA in conventional designs; and (iii) The need for an externally generated stable reference voltage (e.g., from a bandgap reference circuit) is eliminated in the present design. This may give the circuit designer an extra degree of freedom, from a system level design point of view, by freeing up valuable current consumption and die area that may be utilized elsewhere in the system.

The foregoing description of specific embodiments and examples of the invention have been presented for the purpose of illustration and description, and although the invention has been described and illustrated by certain of the preceding examples, it is not to be construed as being limited thereby. The preceding examples are not intended to be exhaustive or to limit the invention to the precise forms disclosed, and many modifications, improvements and variations within the scope of the invention are possible in light of the above teaching. It is intended, therefore, that the scope of the invention encompass the generic area as herein disclosed, and by the claims appended hereto and their equivalents.

It will be appreciated to those skilled in the art having the benefit of this disclosure that this invention is believed to provide a a resistor-less, though highly accurate, low voltage detect circuit. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A low voltage detect circuit configured for detecting when an external voltage (Vext) drops below a predetermined minimum voltage and for generating a detect signal in response thereto, wherein the generation of the detect signal is dependent on a threshold voltage difference between a non-zero threshold transistor having a substantially non-zero threshold voltage, and a zero threshold transistor having a threshold voltage substantially equal to zero.

2. The circuit as recited in claim 1, wherein the non-zero threshold transistor comprises a first threshold voltage ($V_{TH\_NZ}$) within a range of about −1.5V to about −0.5V or within a range of about 0.5V to about 1.5V, and wherein the zero threshold transistor comprises a second threshold voltage ($V_{TH\_Z}$) within a range of about −0.4V to about +0.4V.

3. The circuit as recited in claim 2, wherein the non-zero threshold transistor comprises a first threshold voltage ($V_{TH\_NZ}$) within a range of about 0.8V to about 0.9V, and wherein the zero threshold transistor comprises a second threshold voltage ($V_{TH\_Z}$) within a range of about −0.2V to about +0.2V.

4. The circuit as recited in claim 2, wherein the zero and non-zero threshold transistors each comprise P-channel Metal Oxide Semiconductor (PMOS) transistors.

5. The circuit as recited in claim 2, wherein the zero and non-zero threshold transistors each comprise N-channel Metal Oxide Semiconductor (NMOS) transistors.

6. The circuit as recited in claim 5, comprising substantially no resistors.

7. The circuit as recited in claim 6, comprising:
a first sub-circuit configured to generate voltage signal, A, which is substantially less than or equal to the external voltage;
a second sub-circuit configured to generate voltage signal, B, which is substantially equal to a threshold voltage difference between at least one non-zero threshold transistor and at least one zero threshold transistor; and
a comparator configured to compare voltage signals A and B, and to generate the detect signal when voltage signal A becomes less than or equal to voltage signal B.

8. The circuit as recited in claim 7, wherein the first sub-circuit comprises:
a first non-zero threshold transistor coupled between a power supply node and a first input of the comparator, wherein the first non-zero threshold transistor is diode-connected and configured for receiving the external voltage at a gate terminal thereof; and
a first biasing stage coupled in series with the first non-zero threshold transistor between the first input of the comparator and ground.

9. The circuit as recited in claim 8, wherein the second sub-circuit comprises:
a pair of zero-threshold transistors coupled in series between the power supply node and a second input of the comparator; and
a second biasing stage coupled in series with the pair of zero-threshold transistors between the second input of the comparator and ground.

10. The circuit as recited in claim 9, wherein the pair of zero-threshold transistors comprises a first zero-threshold transistor and a second zero-threshold transistor, and wherein:
the first zero-threshold transistor is coupled between the power supply node and the second zero-threshold transistor, wherein the first zero-threshold MOS transistor is configured for receiving a turn-on voltage at a gate terminal thereof; and
the second zero-threshold transistor is coupled between the first zero-threshold transistor and the second input of the comparator, wherein the second zero-threshold transistor is diode-connected and configured for receiving a threshold voltage difference between a non-zero threshold transistor and a zero threshold transistor, at a gate terminal thereof.

11. The circuit as recited in claim 9, wherein the first and second biasing stages each comprise a non-zero threshold transistor coupled for receiving a bias voltage at a gate terminal thereof.

12. The circuit as recited in claim 11, wherein the circuit comprises a standby current consumption no greater than 120 nano-amperes (nA).

13. The circuit as recited in claim 12, wherein a trip point of the comparator has a maximum variation of +/−100 milli-volts (mV) across process, voltage, and temperature (PVT) corners.

14. The circuit as recited in claim 13, wherein the predetermined minimum voltage is approximately equal to twice the threshold voltage difference between a non-zero threshold transistor and a zero threshold transistor, or 2 times ($V_{TH\_NZ}-V_{TH\_Z}$).

15. The circuit as recited in claim 13, wherein the predetermined minimum voltage is approximately equal to (2+N) times ($V_{TH\_NZ}-V_{TH\_Z}$) if:
the first sub-circuit further comprises an additional N-number of diode-connected non-zero threshold transistors, which are coupled in series between the first non-zero threshold transistor and the first input of the comparator;
the second sub-circuit further comprises an additional N-number of diode-connected zero threshold transistors, which are coupled in series between the second zero threshold transistor and the second input of the comparator; and
wherein the number N is selected from a range of integer values comprising about 1 to about 5.

16. The circuit as recited in claim 13, wherein the predetermined minimum voltage is approximately equal to ($V_{TH\_NZ}-V_{TH\_Z}$) if:
the first non-zero threshold transistor is eliminated from the first sub-circuit and the power supply node is directly coupled to the first input of the comparator; and
the second zero threshold transistor is eliminated from the second sub-circuit and the first zero threshold transistor is coupled between the power supply node and the second input of the comparator.

17. A memory system comprising a power regulator with a low voltage detect circuit for detecting when an external voltage drops below a predetermined minimum voltage, wherein the low voltage detect circuit comprises:
a first sub-circuit configured to generate voltage signal, A, which is substantially less than or equal to the external voltage;
a second sub-circuit configured to generate voltage signal, B, which is substantially equal to a threshold voltage difference between at least one transistor with a substantially non-zero threshold voltage and at least one additional transistor with a threshold voltage close to zero; and
a comparator configured to compare voltage signals A and B, and to generate the detect signal when voltage signal A becomes less than or equal to voltage signal B.

18. The memory system as recited in claim 17, wherein the low voltage detect circuit comprises substantially no resistors or voltage generation circuits.

19. A method for detecting a low-voltage condition and for generating a detect signal in response thereto, the method comprising:
generating a first voltage signal, A, which is substantially less than or equal to an external voltage;
generating a second voltage signal, B, which is substantially equal to a threshold voltage difference between at least one non-zero threshold transistor having a substantially non-zero threshold voltage and at least one zero threshold transistor having a threshold voltage close to zero;

comparing voltage signals A and B and generating the detect signal when voltage signal A becomes less than or equal to voltage signal B, signifying the low-voltage condition.

20. The method as recited in claim 19, wherein said step of generating a first voltage signal, A, comprises establishing a difference between the external voltage and a threshold voltage of at least one non-zero threshold transistor.

21. The method as recited in claim 19, wherein said step of generating a second voltage signal, B, comprises establishing a threshold voltage difference between one non-zero threshold transistor and at least two zero threshold transistors.

22. The method as recited in claim 19, wherein said steps of generating a first and second voltage signal are performed without using any resistors or reference voltage generation circuits.

* * * * *